United States Patent
Yoon et al.

(10) Patent No.: US 6,225,828 B1
(45) Date of Patent: *May 1, 2001

(54) DECODER FOR SAVING POWER CONSUMPTION IN SEMICONDUCTOR DEVICE

(75) Inventors: Hoon Mo Yoon; Geun Young Park, both of Kyoungki-do (KR)

(73) Assignee: Hyundai Electronics Industries Co., Ltd., Ichon-shi (KR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/000,611

(22) Filed: Dec. 30, 1997

(30) Foreign Application Priority Data

Dec. 30, 1996 (KR) .................................. 96-76318

(51) Int. Cl.[7] .............................. H03K 19/00; G11C 8/00
(52) U.S. Cl. ............................................. 326/105; 326/93
(58) Field of Search ...................... 326/105, 106, 326/108, 109, 110, 93, 98, 84

(56) References Cited

U.S. PATENT DOCUMENTS

| 4,837,462 | * | 6/1989 | Watanabe et al. | 326/108 |
| 5,097,158 | * | 3/1992 | Michel | 327/178 |
| 5,103,113 | * | 4/1992 | Inui et al. | 327/108 |
| 5,894,231 | * | 4/1999 | Kuhara | 326/110 |

OTHER PUBLICATIONS

Rhyne, Fundamentals of Digital Systems Design, N.J., pp.70–71, 1973.*

Rudolf F. Graf, Modern Dictionary of Electronics, Howard W. Sams & Co., Inc, pp.165, 1984.*

* cited by examiner

Primary Examiner—Michael Tokar
Assistant Examiner—James A Cho
(74) Attorney, Agent, or Firm—Jacobson, Price, Holman & Stern, PLLC

(57) ABSTRACT

Disclosed is a decoder capable of saving power consumption. The decoder according to the present invention is capable of reducing power consumption without a chip area increase which is caused by the modification of an inverter. The decoder in a semiconductor device comprising NAND gates receiving addresses, BiCMOS inverters for inverting outputs from the NAND gates, a clock generator for providing a clock signal for the NAND gates, to control outputs from the BiCMOS inverters in response to the clock signal. Particularly, the decoder according to the present invention reduces power consumption in a stand-by state.

5 Claims, 5 Drawing Sheets

DECODER FOR SAVING POWER CONSUMPTION IN SEMICONDUCTOR DEVICE

BACKGROUND OF THE INVENTION

1. Field of the Invention

The present invention relates to a decoder using a BiCMOS inverter in a semiconductor and, more particularly, to a decoder capable of saving power consumption.

2. Description of the Related Art

In general, a BiCMOS circuit operates at a high speed, by combining the high driving force of a bipolar transistor and the stable operation characteristics of CMOS transistors. A conventional inverter using BiCMOS transistors doesn't operate with a full swing width which is in a voltage level of the CMOS transistor based on the characteristics of bipolar transistor. The voltage swing of a BiCMOS inverter is decreased by Vbe (base to emitter) voltage, 0.8V. That is, the high voltage level is Vcc to 0.8V and the low voltage level is 0V.

Accordingly, in case where this BiCMOS circuit is used, it is essential that CMOS transistors in a CMOS inverter in the next stage may consume current in their operations. Since the voltage drop of 0.8V is sufficient to weakly turn on a PMOS transistor to be turned off, a CMOS inverter formed between a power supply and a ground voltage level, which includes the PMOS transistor coupled in series to an NMOS transistor, may consume a large amount of current, in particular, in a stand-by state.

To decrease this current consumption, transistors to compensate the voltage drop are added to the inverter for the full swing in the CMOS voltage level. However, this additional transistor increases the area of layout.

FIG. 1 is a schematic view illustrating a conventional BiCMOS inverter. As shown in FIG. 1, the conventional BiCMOS inverter includes a PMOS transistor 101, NMOS transistors 114 and 115 and a bipolar transistor 122. The PMOS transistor 101 has a gate coupled to an input terminal of the inverter and transfers a voltage from a power supply to a base of a bipolar transistor 122. The NMOS transistor 114, which is coupled in series to the PMOS transistor 101, has a gate coupled to the input terminal of the inverter and a source coupled to a ground voltage level. The bipolar transistor 122 has a collector coupled to the power supply and an emitter coupled to an output terminal of the inverter. The NMOS transistor 115 has a gate coupled to the input terminal of the inverter, a drain coupled to the emitter of the bipolar transistor 122 and a source coupled to a ground voltage level.

In case where the transition in going from a high voltage level to a low voltage level is achieved, the current flowing the PMOS transistor 101 applies a voltage to the base of the bipolar transistor 122 so that the output terminal of the inverter becomes a high voltage level. The minimum voltage for turning on the bipolar transistor 122, vbe, is approximately 0.7 to 0.8V. When the voltage of the output terminal increases up to Vcc-Vbe, the voltage difference between the base and the emitter of the bipolar transistor 122 is Vbe. Accordingly, since the bipolar transistor 122 is turned off when the output voltage increases over Vcc-Vbe, the maximum voltage of the output terminal may be Vcc-Vbe. If the output voltage of the inverter drives a CMOS inverter in the next stage, an input voltage applied to the CMOS inverter is Vcc-Vbe. This input voltage makes a direct current path from the power supply to the ground voltage level in the next stage, by simultaneously turning on the PMOS and NMOS transistors in the CMOS inverter. As a result, the inverter having this current path cannot be used in a low power devices.

On the other hand, in case where the transition in going from a low voltage level to a high voltage level is achieved in a voltage applied to the input terminal, the NMOS transistor 114 is turned on so that the base of the bipolar transistor 122 is in a ground voltage level and the NMOS transistors 114 and 115 acts as pull-down transistors which make the output of the inverter low.

The circuit as shown in FIG. 1 is an example of BiCMOS inverter but different inverters can be used for other purposes. However, these inverters may consume a large amount of current when the stand-by state is a high voltage level. Also, an addition of transistors operating in the CMOS level increases the area of the layout.

FIG. 2 is a schematic view illustrating an example of conventional decoder using the BiCMOS inverter of FIG. 1. The conventional decoder receives addresses from "n" input terminals and then outputs values of "1" or "0" to "2ⁿ" output terminals.

The conventional decoder, as shown in FIG. 2, includes four NAND gates 205 having two input terminals and four inverters 210. The two-input NAND gates 205 receives two of input signals A0, A1, A0B and A1B. The inverters 210 receives the outputs from the NAND gates 205 and then outputs decoded output signals D0, D1, D2 and D3, respectively. Also, only one of the output signals D0, D1, D2 and D3 may be in a high voltage level and the decoder typically employs a latch circuit to temporally store an output data in a storage circuit for the next cycle.

Referring to FIG. 3 showing a timing diagram of FIG. 2, when the transition of input signals A0 and A1 is achieved form a low voltage level to a high voltage level 312 in cycle 0, the output signal D3 rises to a high voltage level 316 and the output signal D0 achieves the transition from a high voltage level 326 to a low voltage level 328. At this time, the high voltage levels 316 and 326 are in the voltage of Vcc-Vbe and the low voltage levels 318 and 328 are the ground voltage level. One of the outputs D0 to D3 of the decoder is always in a high voltage level so that the power consumption occurs. In particular, this power consumption may always occur in the stand-by state.

SUMMARY OF THE INVENTION

Therefore, it is an object of the present invention to provide a decoder using a BiCMOS inverter and being capable of reducing power consumption without a chip area increase which is caused by the modification of an inverter.

In accordance with an aspect of the present invention, there is provided a decoder in a semiconductor device comprising: a plurality of NAND gates receiving addresses; a plurality of BiCMOS inverters for inverting outputs from the NAND gates; a clock generator for providing a clock signal for the NAND gates, whereby the clock signal controls outputs from the BiCMOS inverters. The BiCMOS inverters are respectively coupled to CMOS inverters and disabled when the clock signal is in a low voltage level. The clock signal is in a low voltage level when the decoder is in a stand-by state.

BRIEF DESCRIPTION OF THE DRAWINGS

Other objects and aspects of the invention will become apparent from the following description of the embodiments with reference to the accompanying drawings, in which.

DETAILED DESCRIPTION OF THE INVENTION

Hereinafter, a decoder according to the present invention will be described in detail referring to the accompanying drawings.

Figure 4:
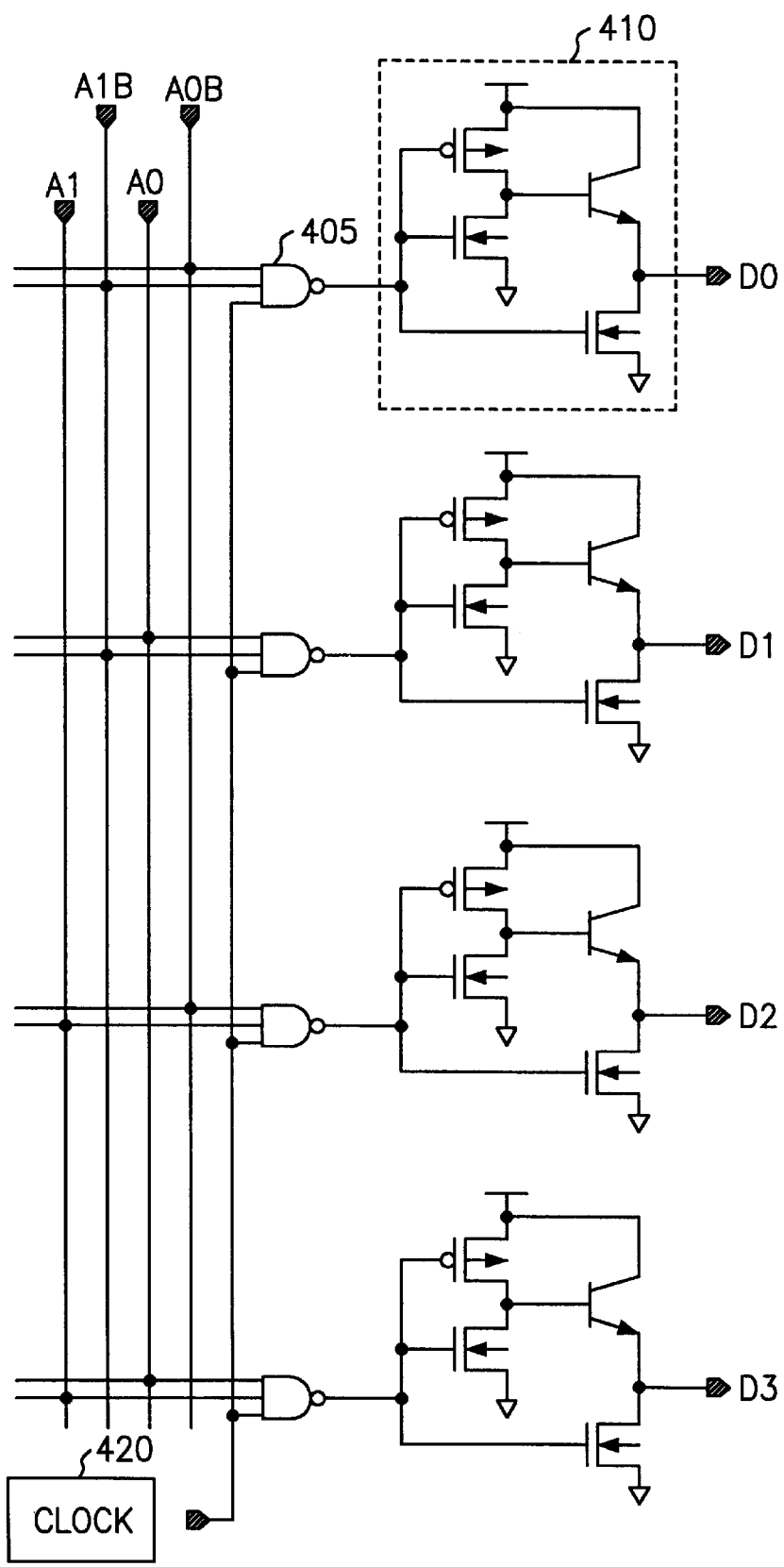
FIG. 4 is a schematic view illustrating an embodiment of decoder according to the present invention.

First, referring to FIG. 4, the decoder according to the present invention includes four NAND gates 405 having three input terminals and four inverters 410. The three-input NAND gates 405 receives two of input signals A0, A1, A0B and A1B and an internal clock signal 420.

Figure 1:
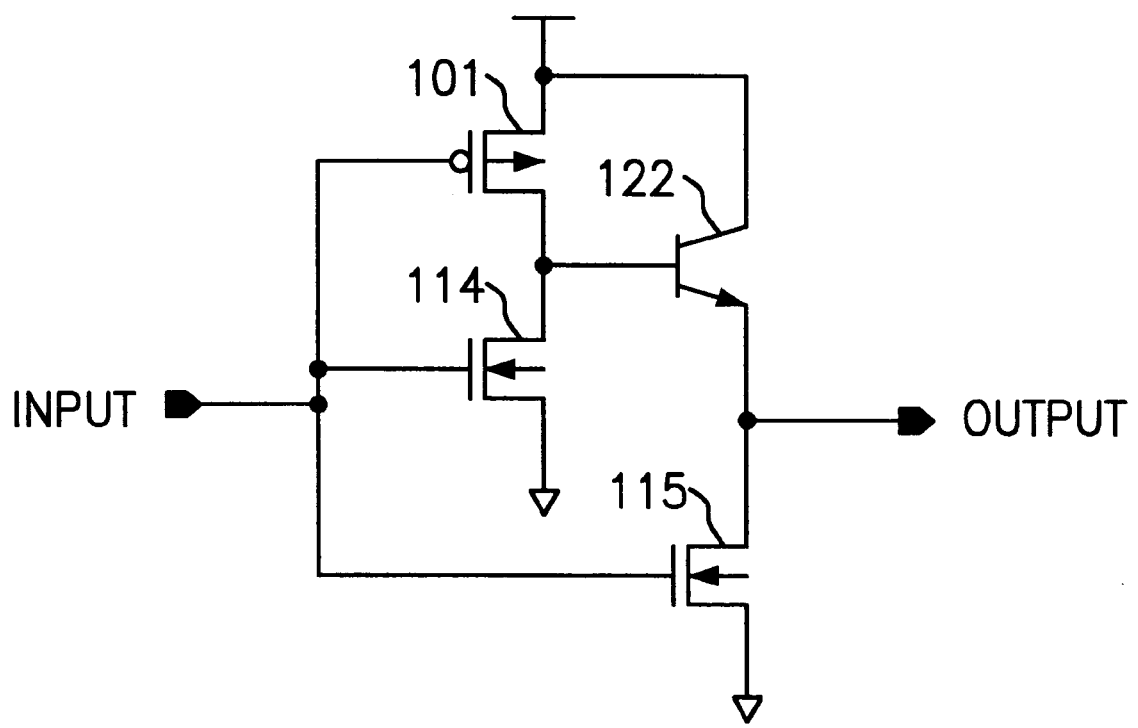
FIG. 1 is a schematic view illustrating a conventional BiCMOS inverter.
Figure 2:
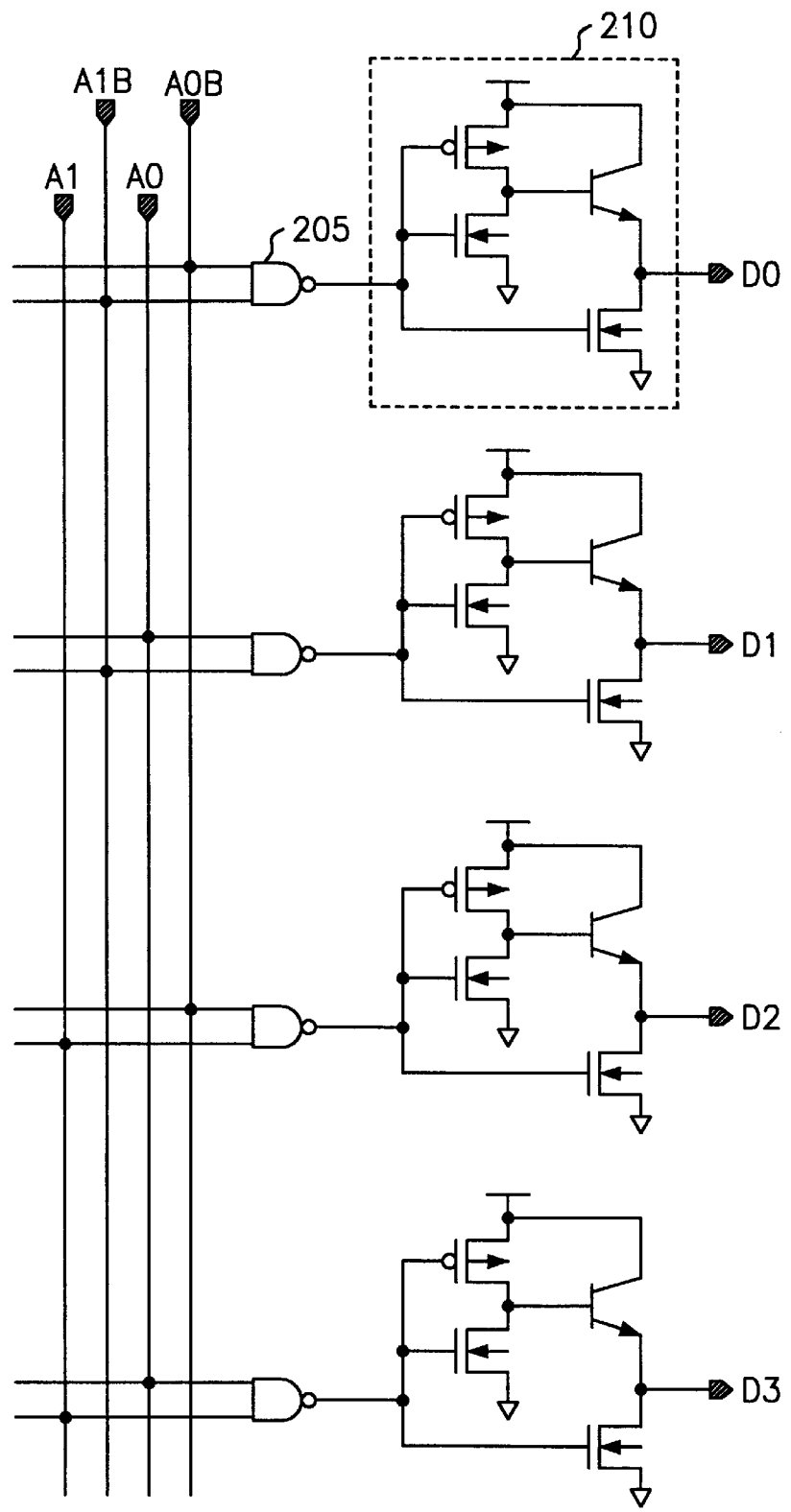
FIG. 2 is a schematic view illustrating an example of conventional decoder using the inverter of FIG. 1.
Figure 3:
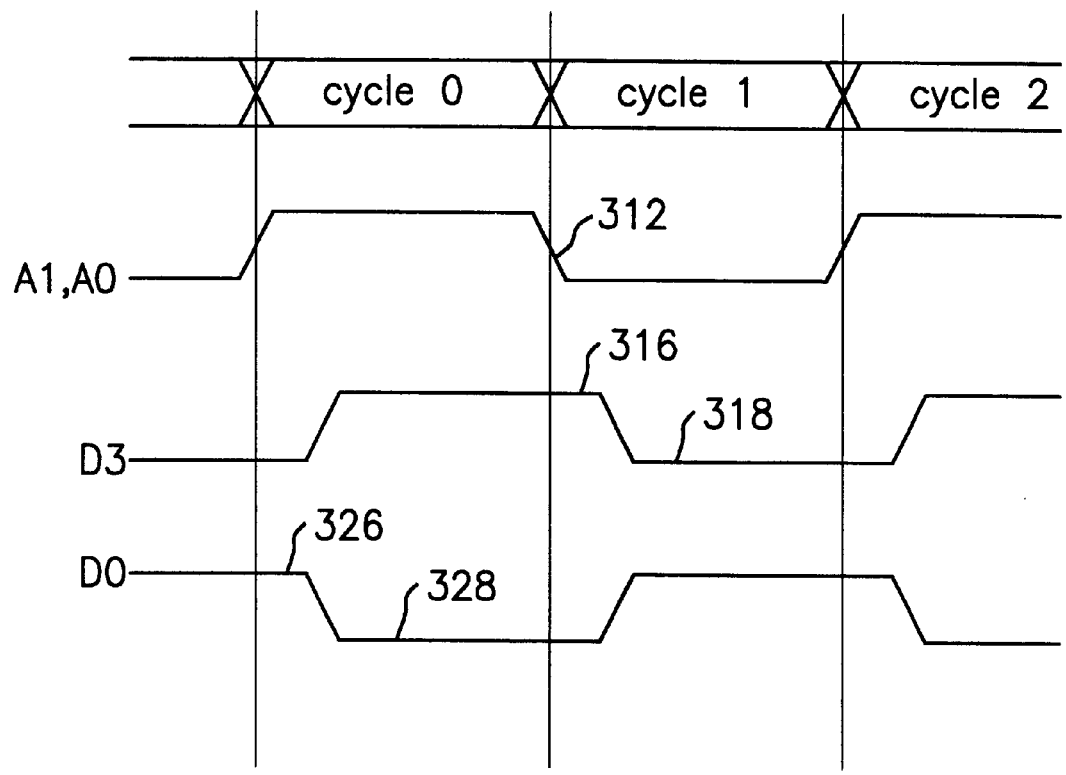
FIG. 3 is a timing diagram of FIG. 2.

In similar to the decoder of FIG. 2, the inverters 410 according to the present invention receives the outputs from the three-input NAND gates 405 and then outputs decoded output signals D0, D1, D2 and D3, respectively.

Figure 5:
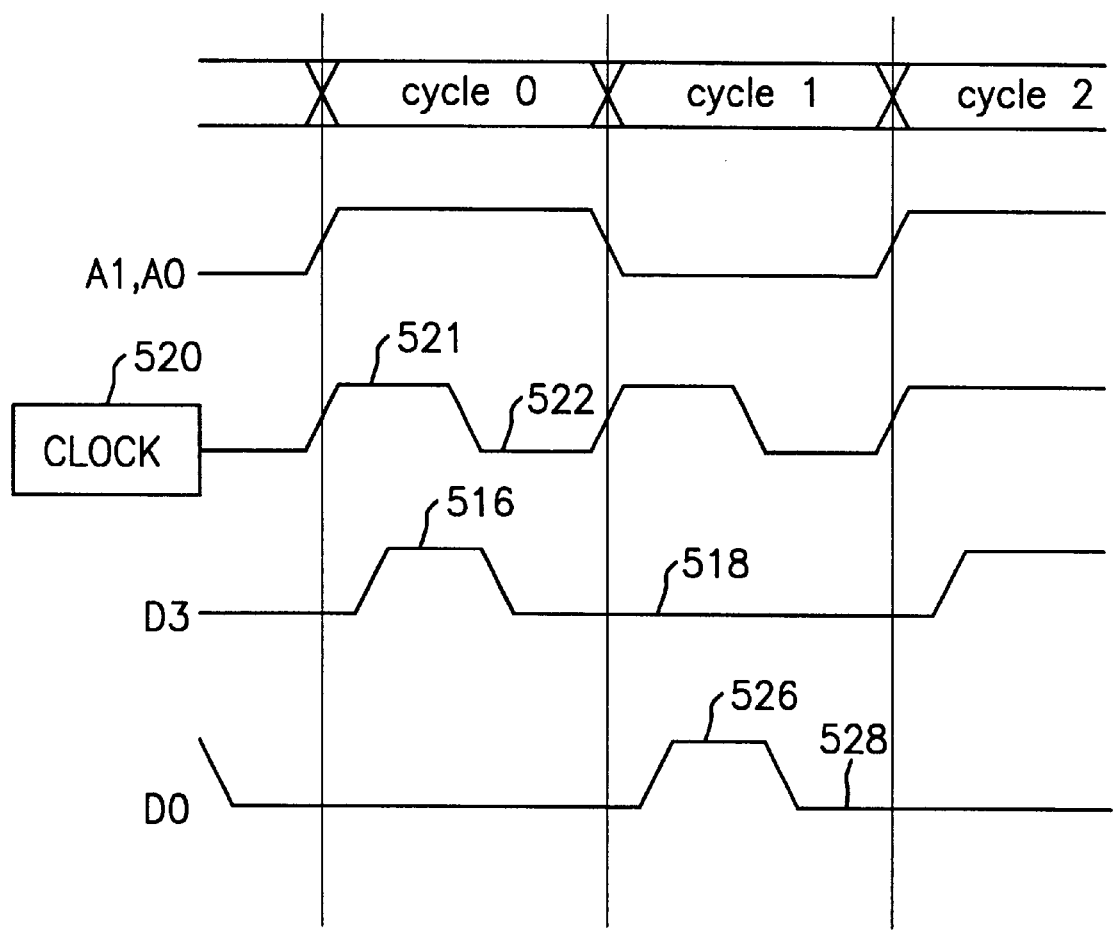
FIG. 5 is a timing diagram of FIG. 4.

Referring to FIG. 5, in which a timing diagram of FIG. 4 is shown, when the internal clock signal 520 is in a high voltage level, the decoder according to the present invention carries out the same operation as that shown in FIG. 2. That is, if the internal clock signal 520 is in a high voltage level 521 at cycle 0, the fourth decoder (D3) outputs a high logic signal 516 of Vcc-Vbe. On the contrary, when the internal clock signal 520 is in a low voltage level 522, the fourth decoder (D3) outputs a low logic signal 518 at cycle 0. Likewise, at cycle 1, if the internal clock signal 520 is in a high voltage level 521, the first decoder (DO) outputs a high logic signal 526 and, when the internal clock signal 520 is in a low voltage level, the first decoder (D0) outputs a low logic signal 528.

This output characteristics are resulted from the NAND gates 405. Since the NAND gates 405 outputs a high logic signal although only one low logic signal is input, it is possible to control the output of the inverters 410 using the internal clock signal.

The internal clock signal 420 is produced by the combination of the chip select signal (CS) and an external clock signal. In the preferred embodiment, a clock generator to produce the internal clock signal can be constructed, by using a logic gate NANDing the chip select signal (CS) and an external clock signal. Also, the reduction of power consumption in the stand-by state is achieved by making it low to the output voltage level of the clock generator when the chip select signal (CS) is in a high voltage level. As a result, the low voltage level from the clock generator causes the decoder to be in a stand-by state with the low power consumption. Particularly, in case of the synchronous device for which a clock signal is provided, the present invention may be easily embodied.

As apparent form the above description, the present invention reduces power consumption, by providing clock signal without the chip area increase which is caused by the modification of an inverter.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A decoder in a semiconductor device comprising:
   a plurality of NAND gates receiving addresses;
   a plurality of BiCMOS inverters for inverting outputs from the NAND gates;
   a clock generator for providing an internal system signal to the NAND gates to control the outputs from the BiCMOS inverters, wherein the internal system signal is a combination signal of a chip select signal and an external clock signal.

2. The decoder in accordance with claim 1, wherein the BiCMOS inverters are respectively coupled to CMOS inverters.

3. The decoder in accordance with claim 1, wherein the BiCMOS inverters are disabled when the internal system signal is in a low voltage level.

4. The decoder in accordance with claim 1, wherein the internal system signal is produced by using a logic gate NANDing the chip select signal and the external clock signal.

5. The decoder in accordance with claim 1, wherein the internal system signal is in a low voltage level when the decoder is in a stand-by state.

\* \* \* \* \*